(12) United States Patent
Klein

(10) Patent No.: US 6,774,049 B2
(45) Date of Patent: *Aug. 10, 2004

(54) ELECTROLESS DEPOSITION OF DOPED NOBLE METALS AND NOBLE METAL ALLOYS

(75) Inventor: Rita J. Klein, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/375,783

(22) Filed: Feb. 26, 2003

(65) Prior Publication Data

US 2003/0153143 A1 Aug. 14, 2003

Related U.S. Application Data

(63) Continuation of application No. 10/085,182, filed on Feb. 27, 2002, which is a continuation of application No. 09/652,208, filed on Aug. 31, 2000, now Pat. No. 6,518,198.

(51) Int. Cl.[7] ............................................. H01L 21/31
(52) U.S. Cl. ........................ 438/758; 427/304; 427/305; 427/306
(58) Field of Search ................................. 438/758, 244

(56) References Cited

U.S. PATENT DOCUMENTS

| | | | |
|---|---|---|---|
| 3,748,137 A | 7/1973 | Worth et al. | |
| 4,066,804 A | 1/1978 | Andrews | |
| 4,259,409 A | 3/1981 | Arnold | |
| 4,341,846 A | 7/1982 | Hough et al. | |
| 4,564,424 A | 1/1986 | Cassat et al. | |
| 4,565,606 A | 1/1986 | Cassat | |
| 4,816,070 A | 3/1989 | Holtzman et al. | |
| 4,882,202 A | 11/1989 | Holtzman et al. | |
| 5,260,234 A | 11/1993 | Long | |
| 5,268,259 A | 12/1993 | Sypula | |
| 5,282,946 A | 2/1994 | Kinoshita et al. | |
| 5,318,803 A | * 6/1994 | Bickford et al. | ............ 427/306 |
| 5,332,646 A | * 7/1994 | Wright et al. | ................ 430/137 |
| 5,384,284 A | 1/1995 | Doan et al. | |
| 5,443,865 A | 8/1995 | Tisdale et al. | |
| 6,489,235 B2 | * 12/2002 | Gilton et al. | ................ 438/643 |
| 6,503,375 B1 | * 1/2003 | Maydan et al. | ............. 204/242 |

OTHER PUBLICATIONS

Stumpf, Roland, et al., "Retardation of O Diffusion Through Polycrystalline Pt by Be Doping," *Physical Review B*, vol. 59, No. 24, Jun. 15, 1999, pp. 16 047–16 052.

Mallory, Glenn O. et al., eds. Electroless Plating: Fundamentals and Applications, pp. 432–440 (1990).

Younan et al., "Effect of heat treatment on electroless ternary nickel–cobalt–phosphorus allow," Journal of Applied Electrochemistry 32, pp. 439–446, 2002.

Schlesinger, Mordechay, "Electroplating", Electrochemistry Encyclopedia, Sep. 2002, 9 pages, http:/electrochem.cwri.edu/ed/encycl/art–e01–electroplat.htm.

* cited by examiner

*Primary Examiner*—David Nelms
*Assistant Examiner*—Thao P. Le
(74) *Attorney, Agent, or Firm*—TraskBritt

(57) ABSTRACT

A method for forming an oxidation barrier including at least partially immersing a semiconductor device structure in an electroless plating bath that includes at least one metal salt and at least one reducing agent. The reaction of the at least one metal salt with the at least one reducing agent simultaneously deposits metal and a dopant thereof. The oxidation barrier may be used to form conductive structures of semiconductor device structures, such as a capacitor electrode, or may be formed adjacent conductive or semiconductive structures of semiconductor device structures to prevent oxidation thereof. The oxidation barrier is particularly useful for preventing oxidation during the formation and annealing of a dielectric structure from a high dielectric constant material, such as $Ta_2O_5$ or BST.

66 Claims, 2 Drawing Sheets

ELECTROLESS DEPOSITION OF DOPED NOBLE METALS AND NOBLE METAL ALLOYS

CROSS-REFERENCE TO RELATED APPLICATIONS

This application is a continuation of application Ser. No. 10/085,182, filed Feb. 27, 2002, pending, which is a continuation of application Ser. No. 09/652,208, filed Aug. 31, 2000, now U.S. Pat. No. 6,518,198, issued Feb. 11, 2003.

BACKGROUND OF THE INVENTION

1. Field of the Invention

The present invention relates to semiconductor device structures with thin layers of conductive materials that are oxidation resistant and that act as oxidation barriers to protect underlying conductive or semiconductive structures. More specifically, the present invention relates to semiconductor device structures including with thin layers with noble metals that have been doped to prevent the passage of oxidants therethrough, as well as to methods for forming such thin, doped noble metal layers. The invention also pertains to the use of electroless plating techniques to form oxidation barrier layers from noble metal alloys.

2. State of the Art

The thicknesses of conductive layers and conductive lines in conventional semiconductor devices may themselves prevent significant oxidation of these conductive layers and lines, as well as the passage of oxidants through these layers or lines. In the state of the art, however, the dimensions of features, including the thicknesses thereof, are ever decreasing.

For example, in stacked capacitor structures, the thicknesses of the electrodes and capacitor dielectrics are continuously becoming smaller. As a result of the decrease in capacitor dielectric layer thicknesses, materials with higher dielectric constants, such as tantalum pentoxide ($Ta_2O_5$) and barium strontium titanate (BST or $BaSrTiO_3$), are being used with increased frequency.

As another result of the decreasing thicknesses of conductive features of semiconductor device structures, the oxidation of these conductive features that may occur upon formation of adjacent insulative structures often has detrimental effects on the electrical properties of the conductive features. This is particularly true in the thin bottom electrodes of state of the art capacitors as capacitor dielectric layers are formed thereover.

Accordingly, it is desirable to form at least the bottom electrode of a capacitor structure from a material that will not oxidize as a capacitor dielectric layer is being formed thereover or from a material that will substantially retain its conductive properties upon being oxidized. Examples of such materials that have been used as the electrodes in capacitors include platinum (Pt), ruthenium (Ru), ruthenium oxide ($RuO_2$), rhodium (Rh), rhodium oxide ($RhO_2$), iridium (Ir), iridium oxide ($IrO_2$), palladium (Pd), and molybdenum oxide ($MoO_2$).

In addition, due to the ever-decreasing dimensions of features of semiconductor devices, such as the bottom electrodes of capacitors, oxidants are able to more easily travel through these features and to oxidize underlying conductive or semiconductive structures, such as active device regions or conductive (e.g., polysilicon) plugs. In state of the art capacitor structures, this is true even if oxidation resistant materials or materials that form conductive oxides are used to fabricate bottom electrodes.

The problem of oxidants permeating and traveling through the bottom electrode of a capacitor structure is further exacerbated by the extremely high temperatures (e.g., about 600° C. and greater) that are employed to form the dielectric layers of state of the art capacitors and anneal these dielectric layers to the underlying bottom electrode. These high temperatures increase the tendency of oxidants to pass through the underlying layer of conductive material.

It has been found that the incorporation of small amounts of beryllium in platinum films retards oxygen diffusion by influencing the grain structure of the platinum film. (See, Roland Stumpf, et al., *Retardation of O Diffusion Through Polycrystalline Pt by Be Doping*, The American Physical Society, Jun. 15, 1999, at 16 047–16 052 (hereinafter "Stumpf")). The platinum film was formed by sputtering, then implanted with beryllium. The use of sputtering to form platinum layers is, however, somewhat undesirable since sputtering may result in layers that do not conformally cover high aspect ratio features, such as the high aspect ratio bottom electrodes that are often present in state of the art, relatively large surface area capacitor structures.

The use of boron-doped platinum films in capacitor structures has also been investigated, but boron doping of platinum was determined not to have as significant an affect on oxygen diffusion as beryllium doping of platinum. Id. at 16,050–51.

Platinum-rhodium and platinum-iridium alloys are also known to prevent the passage of oxidants therethrough. These layers of oxidation barrier alloys have been formed by processes such as reactive radiofrequency (RF) sputtering, which typically require high process temperatures of about 500° C. or greater.

The inventor is not aware of any art that teaches the use of electroless plating techniques for forming conductive, oxidation-barrier layers of semiconductor device structures in a single step and that substantially conformally cover high aspect ratio features of semiconductor device structures, while preventing the passage of oxidants therethrough to underlying structures.

BRIEF SUMMARY OF THE INVENTION

The present invention includes a substantially confluent, conductive, oxidation barrier layer or structure that is oxidation resistant and that substantially prevents oxidants from passing therethrough, as well as capacitor structures and other semiconductor device structures including such conductive layers.

An exemplary embodiment of the conductive layer includes platinum doped with phosphorous or boron. For example, the conductive layer may include about 0.1% to about 5% boron, by weight of the layer.

As another example, the conductive layer may include an alloy of noble metals, such as a platinum-rhodium alloy or a platinum-iridium alloy.

The present invention also includes methods for forming conductive layers or structures that resist oxidation and that substantially prevent the passage of oxidants therethrough. By way of example, electroless plating techniques may be used to form both the exemplary doped platinum conductive layer or structure and the noble metal alloy conductive layer or structure. The processes that are used to form the conductive layer are preferably substantially conformal processes, which form the layer on both nonvertical surfaces of underlying structures and substantially vertical surfaces of underlying structures, including the substantially vertical surfaces of structures with high aspect ratios.

As an example of an electroless plating process that may be used to form the conductive oxidation barrier, a substrate may be introduced into an aqueous metal solution including at least one metal salt and at least one reducing agent. When a reducing agent that includes dopant atoms, such as a borohydride, is employed, the metal atoms of the metal salt and the dopant atoms of the reducing agent are said to be "co-deposited" upon formation of a barrier layer. Alternatively, when a combination of salts of different metals are used, the metals are said to be co-deposited as an alloy.

Examples of the one or more metal salts that may be used in the aqueous metal solution include, without limitation, salts of noble metals, such as platinum, rhodium, iridium, ruthenium, palladium, or alloys including any of these metals. The one or more reducing agents that may be used in an aqueous metal solution in accordance with the method of the present invention may include, but are not limited to, agents that will result in a conductive layer that is doped with boron or another dopant that is useful for forming a conductive layer that acts as an oxidation barrier. For example, dimethylamineborane (DMAB), potassium borohydride, sodium borohydride, or other borohydrides may be used as the one or more reducing agents of the aqueous metal solution. When the oxidation barrier includes a metal alloy, hydrazine may be used as the reducing agent, as may other suitable reducing agents that cause dopants to be introduced into a formed oxidation barrier layer.

The methods of the present invention may be used to form an oxidation barrier to be positioned adjacent a conductive layer or a conductive layer that also acts as an oxidation barrier. Accordingly, by forming an oxidation barrier in accordance with the inventive method, one or more underlying components of a semiconductor device structure, such as polysilicon plugs or active device regions that underlie the bottom electrodes of capacitor structures, may be protected from oxidation.

The present invention also includes semiconductor device structures, including capacitor structures, that have been formed in accordance with teachings of the present invention, or that include doped metal oxidation barriers or noble metal alloy oxidation barriers.

Other features and advantages of the present invention will become apparent to those of skill in the art through a consideration of the ensuing description, the accompanying drawings, and the appended claims.

BRIEF DESCRIPTION OF THE SEVERAL VIEWS OF THE DRAWINGS

In the drawings, which illustrate exemplary embodiments of the present invention.

DETAILED DESCRIPTION OF THE INVENTION

Figure 1:
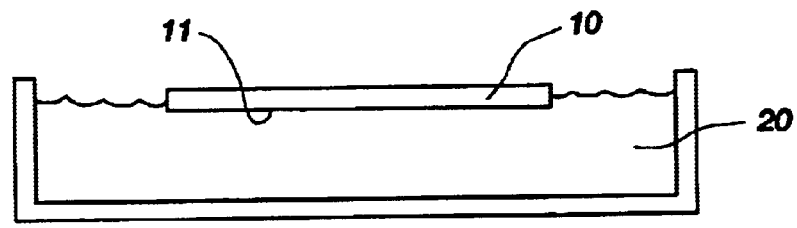
FIG. 1 is a schematic representation depicting immersion of a semiconductor device structure in an electroless bath solution to form a doped metal oxidation barrier.

In an exemplary embodiment of the present invention, electroless plating techniques are employed to form a doped metal oxidation barrier. With reference to FIG. 1, a semiconductor device structure 10 is dipped into, or at least partially immersed in, an electroless plating bath 20, which forms an oxidation barrier layer 12 (see FIGS. 2–4) on a surface of semiconductor device structure 10. Preferably, only an active surface 11 of semiconductor device structure 10 is dipped into bath 20. As shown, semiconductor device structure 10 is contained on a wafer. Alternatively, semiconductor device structure 10 may be included on any other known type of large scale substrate, such as a whole or partial wafer of silicon, gallium arsenide, or indium phosphide, or a silicon on insulator (SOI) type substrate, such as a silcon on glass (SOG), silicon on ceramic (SOC), or silicon on sapphire (SOS) substrate. Individual semiconductor devices 10 or collections of individual semiconductor devices 10 may also be plated in accordance with teachings of the present invention.

As is well known, electroless plating techniques utilize common, inorganic metal salts and agents that reduce the metal salts, referred to as "reducing agents," to effect the formation of a metal layer. As a result, electroless plating techniques do not require expensive deposition equipment. Electroless plating is, therefore, an inexpensive alternative to the use of physical vapor deposition (PVD) and chemical vapor deposition (CVD) processes. In addition, excellent step coverage is obtained using electroless plating. Further, when electroless plating techniques are used to form metal layers, the reaction between one or more metal salts and one or more reducing agents may result in the introduction of impurities, referred to as "dopants," into the metal layers as the metal layers are formed. Thus, the metal and the dopant are said to be "co-deposited" when electroless plating techniques are employed.

As an example, an oxidation barrier layer 12 (FIGS. 2–4) including a boron-doped noble metal (e.g., platinum, rhodium, iridium, ruthenium, palladium, or alloys including noble metals) may be formed upon a semiconductor device structure 10 by electroless plating techniques, in accordance with teachings of the present invention. Exemplary reducing agents for the noble metal salt include, but are not limited to, borohydride ($BH_4$) (e.g., potassium borohydride), which react with the salt of a noble metal in a way that causes a formed layer of the noble metal to be doped with boron. Of course, reducing agents that result in the introduction of other dopants into a metal layer during electroless deposition thereof are also within the scope of the present invention. A metal layer formed in accordance with teachings of the present invention may include any amount of dopant that permits the metal layer to substantially retain its electrical properties, while enhancing the ability of the metal layer to prevent oxidants from permeating same or from passing therethrough. For example, when boron is employed as a dopant in a noble metal layer, the boron may comprise about 0.1% to about 5.0% of the weight of the metal layer.

The following examples are illustrative of electroless plating baths 20 (FIG. 1) and accompanying methods that may be employed in accordance with teachings of the present invention to form doped metal oxidation barriers on semiconductor device structures:

EXAMPLE 1

An electroless plating bath for depositing boron-doped platinum may include 10 g/L $Na_2Pt(OH)_6$, 5 g/L NaOH, 10 g/L ethylamine, and 1 g/L hydrazine, as disclosed in Mallory, GO and Hadju, J, eds., *Electroless Plating: Fundamentals and Applications*, 432–433 (hereinafter "Mallory"). It is believed that a borohydride could be substituted for or used along with hydrazine as a reducing agent to effect deposition of a doped metal layer in accordance with teachings of the present invention. Deposition may be effected at a temperature of about 35° C. Id. The boron-doped platinum is plated onto a substrate, such as a semiconductor device structure, at a rate of approximately 12.7 μm/hour. Id. Accordingly, when the method of EXAMPLE 1 is employed, substantially conformal conductive layers having thicknesses of about 100 Å or less may be formed on semiconductor device structures, for example, as oxidation barriers for capacitor structures or as bottom electrodes for capacitor structures, in less than about one hour. Thicker layers, for example, layers having thicknesses of up to about 500 Å or more, may also be formed relatively quickly.

EXAMPLE 2

In an alternative embodiment of the method of the present invention, an electroless plating bath may be prepared by dissolving a substantially pure platinum sponge in aqua regia, evaporating the solution with low heat, dissolving the residue in about 4% by volume hydrochloric acid (HCl), evaporating the solution, and re-dissolving the residue in a volume of about 4% HCl at a volume of about 100 mL per gram of platinum, as disclosed in Mallory. As is also disclosed in Mallory, the resulting solution is mixed with an equal volume of about 1% hydrazine. It is believed that a borohydride could be used in place of or along with the hydrazine to effect the formation of a doped metal oxidation barrier in accordance with the present invention. Following preparation of the plating bath, the plating bath is preferably warmed from about room temperature to a temperature of about 60° C. to about 70° C. A semiconductor device structure upon which a doped metal oxidation barrier layer is to be formed is disposed in the bath for the appropriate amount of time, which, of course, depends upon the desired thickness of the doped metal layer.

EXAMPLE 3

Another embodiment of the method of the present invention includes use of an electroless plating bath that is prepared by dissolving a substantially pure platinum sponge in aqua regia, evaporating the solution with low heat, dissolving the residue in water, evaporating the solution again, and dissolving the residue in water again to form a solution including a concentration of about 10 g/L platinum. This platinum solution is then added to an aqueous solution including about 50%, by volume, of a suitable reducing agent (e.g., hydrazine, as disclosed in Mallory at pages 433–34, or a borohydride) and concentrated ammonium hydroxide ($NH_4OH$). The volume of ammonium hydroxide added to the mixture is preferably about twenty percent of the total volume of the resulting solution. As an example, the resulting solution may include concentrations of about 1 g/L platinum and about 4 mL/L of the reducing agent. The preferred plating temperature of the bath is initially at about room temperature or slightly warmer (e.g., up to about 46° C.). The temperature of the electroless plating bath is then increased over a period of about ten minutes to about 70° C. to about 75° C. Plating at the elevated temperature may continue for about thirty minutes or longer, depending upon the desired thickness of the doped metal layer to be formed on a semiconductor device structure.

Sulfonic acids or non-ionic surfactants may also be added to the preceding electroless plating baths in amounts that will enhance the plating performances of these baths.

EXAMPLE 4

In yet another embodiment of the method of the present invention, an electroless plating bath may be prepared by employing a complexing agent, such as ethylenediamine, a stabilizer, such as rhodanine (2-mercapto-4-hydroxythiazole), and sodium borohydride ($NaBH_4$) as the reducing agent. The metal salt $Na_2PtCl_6$ could be employed. In preparing the solution, each of the foregoing components, except the sodium borohydride, may be dissolved in water and the solution heated to and maintained at a temperature of about 70° C. for about 15 minutes to permit substantially complete complexation. The reducing agent, which is preferably substantially purified and is part of a solution including sodium hydroxide (NaOH) as the purifying agent, may then be added. Alternatively, the solution may be maintained at room temperature to permit complexing to occur, then the temperature is increased following addition of the reducing agent to facilitate electroless deposition. Exemplary concentrations of each of these elements are as follows:

0.0051M $Na_2PtCl_6$
0.5M ethylenediamine
1.0M sodium hydroxide
0.00007M rhodanine
0.013M sodium borohydride (Mallory, at 436.) A semiconductor device structure may be immersed in the bath for a sufficient duration to effect plating of a doped platinum layer of desired thickness on a surface thereof.

Each of the foregoing methods are useful for forming doped metal oxidation barriers on semiconductor device structures, with the metal and the dopant thereof being substantially simultaneously deposited onto the semiconductor device structures.

It is believed that the presence of a dopant, such as boron, in a noble metal layer reduces the ability of oxygen to permeate the metal layer by influencing the grain structure of the metal. The grain structure can also be influenced by manipulating components of the electroless plating bath solution. For example, the use of different chemicals may result in different deposition rates. A fast deposition rate of the metal will result in small grains and, thus, even a greater reduction in oxygen diffusion through the deposited metal layer. In contrast, a slow deposition rate of the metal will result in larger grains, which will not prevent oxygen diffusion to the same extent as layers with smaller grains. The grain structure may also be affected by use of different metal salts or a change in the concentration of the salts.

EXAMPLE 5

Oxidation barrier layers that include alloys of noble metals may be formed by substituting the borohydride reducing agents of any of EXAMPLES 1–3 with hydrazine and by use of at least one other salt of a noble metal, such as a salt of rhodium or a salt of iridium, in addition to the $Na_2Pt(OH)_6$ employed in EXAMPLES 1–3 or $Na_2PtCl_6$, which may be reduced by either hydrazine or a borohydride. As another alternative, dimethylamineborane (DMAB) could be used as a reducing agent in electroless plating techniques for forming oxidation barrier layers or structures on semiconductor device structures in accordance with teachings of the present invention. Of course, the inclusion of dopants in these alloy oxidation barriers by use of reducing agents, such as borohydrides, may further prevent the passage of oxidants through the alloy oxidation barriers.

Figure 3:
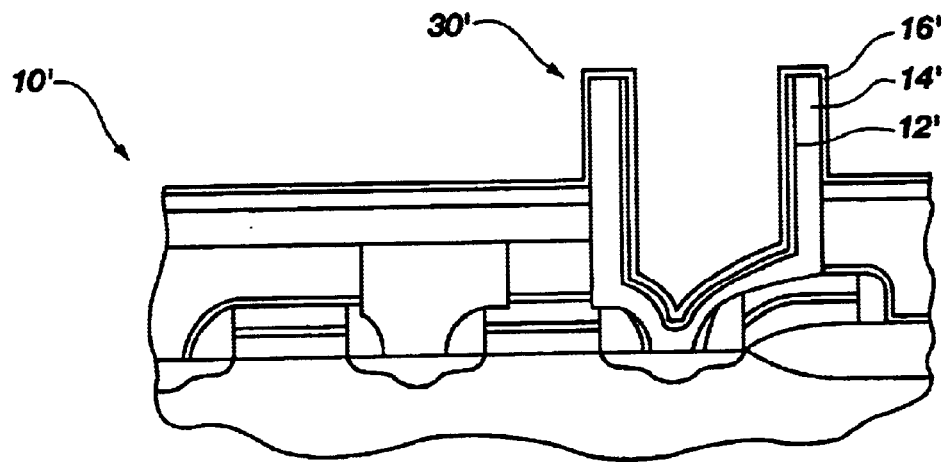
FIG. 3 is a cross-sectional representation of another embodiment of a capacitor structure, including an oxidation barrier beneath the capacitor dielectric thereof, overlying the bottom electrode.

Referring now to FIG. 3, which depicts semiconductor device structure 10' as including a capacitor 30', oxidation barrier layer 12' is formed over a bottom electrode 14' and beneath a dielectric layer 16' of capacitor 30'. Accordingly, any suitable conductive material may be used to form bottom electrode 14', regardless of the ability of that conductive material to resist oxidation or to retain its conductive properties upon oxidation thereof. Preferably, the combined thicknesses of bottom electrode 14' and oxidation barrier layer 12' collectively provide the desired electrical properties of a bottom electrode to the capacitor 30' being fabricated. In addition, it is preferred that the materials of bottom electrode 14' and oxidation barrier layer 12' are compatible and that the contact resistance therebetween is at an acceptable level.

As can be seen in FIG. 3, oxidation barrier layer 12' is formed after bottom electrode 14' has been formed, but before the material of dielectric layer 16' is deposited thereover. Dielectric layer 16' may then be formed over oxidation barrier layer 12' from materials such as $Ta_2O_5$ or BST by known processes. Of course, other features of semiconductor device structure 10' that overlie dielectric layer 16', such as the upper electrode of capacitor 30', may then be fabricated, as known in the art.

Figure 2:
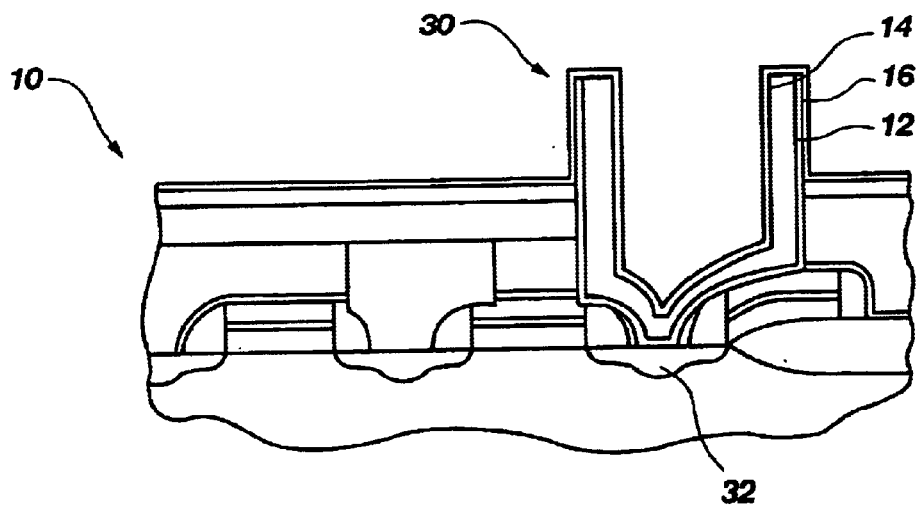
FIG. 2 is a cross-sectional representation of a capacitor structure of a semiconductor device structure including an oxidation barrier underlying the bottom electrode.

As shown in FIG. 2, in another embodiment of semiconductor device structure 10 incorporating teachings of the present invention, which also includes a capacitor 30 under fabrication, an oxidation barrier layer 12 may be located beneath a conductive structure, such as the depicted bottom electrode 14. As oxidation barrier layer 12 is located beneath the conductive structure, it prevents oxidation of underlying conductive or semiconductive structures 32, such as a polysilicon plug or active device region, but does not prevent oxidation of an overlying conductive structure, such as bottom electrode 14. Accordingly, bottom electrode 14 is preferably formed from an oxidation resistant material, such as platinum, ruthenium, ruthenium oxide, rhodium, rhodium oxide, iridium, iridium oxide, palladium, and molybdenum oxide.

Following the fabrication of oxidation barrier layer 12, bottom electrode 14, dielectric layer 16 and other features of semiconductor device structure 10 that overlie dielectric layer 16, such as the upper electrode of capacitor 30, may be fabricated, as known in the art.

Figure 4:
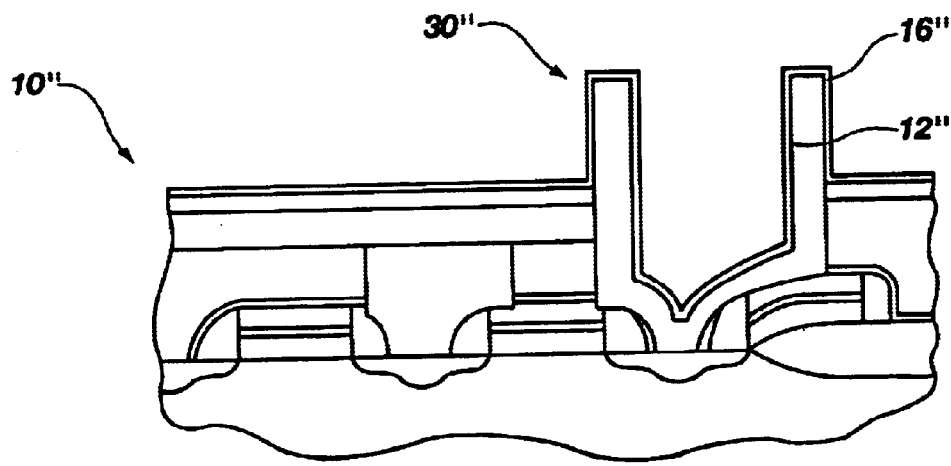
FIG. 4 is a cross-sectional representation of an embodiment of a capacitor structure wherein the bottom electrode is also an oxidation barrier.

FIG. 4 illustrates still another embodiment of semiconductor device structure 10" incorporating teachings of the present invention. Semiconductor device structure 10" also includes a capacitor 30". The bottom electrode of capacitor 30" is formed by an oxidation barrier layer 12" that includes a doped conductive material, such as the oxidation barrier-doped conductive materials disclosed herein. Preferably, the conductive material of oxidation barrier layer 12" is itself resistant to oxidation. Accordingly, oxidation barrier layer 12" may include a doped noble metal.

Of course, after oxidation barrier layer 12" has been fabricated, other features of semiconductor device structure 10" that overlie dielectric layer 16", such as the upper electrode of capacitor 30", may be fabricated by known processes. Known processes, including, without limitation, mechanical or chemical-mechanical polishing (CMP), dry etching, and wet etching, may be employed to remove the materials of the formed oxidation barrier layers from locations on a semiconductor structure where the presence of such a layer is not desired, as well as to pattern the oxidation barrier layers.

While the present invention has been illustrated with respect to a certain type of capacitor structure, it should be understood that the oxidation barrier layers of the present invention may be included in any suitable type of semiconductor device structure, including, without limitation, other types of capacitors, transistor gate structures, and wiring lines, and still remain within the scope of the invention. In addition, methods incorporating teachings of the present invention may be employed to fabricate oxidation barriers in any type of semiconductor device structure.

Although the foregoing description contains many specifics and examples, these should not be construed as limiting the scope of the invention, but merely as providing illustrations of some of the presently preferred embodiments. Similarly, other embodiments of the invention may be devised which do not depart from the spirit or scope of the present invention. The scope of the invention is, therefore, indicated and limited only by the appended claims and their legal equivalents, rather than by the foregoing description. All additions, deletions, and modifications to the invention as disclosed herein and which fall within the meaning of the claims are to be embraced within their scopes.

What is claimed is:

1. A method for forming an oxidation barrier beneath a dielectric layer of a of a semiconductor device structure, comprising:

providing a semiconductor device structure including a substrate with at least one active device region formed therein;

fabricating a conductive structure over the substrate and in communication with the at least one active device region;

introducing at least part of the semiconductor device structure into an aqueous metal solution comprising at least one metal salt and at least one reducing agent so as to form the oxidation barrier over at least the substrate and the at least one active device region thereof; and forming the dielectric layer after the introducing.

2. The method of claim 1, wherein introducing comprises forming the conductive structure.

3. The method of claim 1, wherein introducing comprises forming the oxidation barrier between the conductive structure and the substrate.

4. The method of claim 1, wherein introducing comprises forming the oxidation barrier over the conductive structure.

5. The method of claim 1, wherein introducing comprises introducing at least part of the semiconductor device structure into the aqueous metal solution, with the at least one metal salt comprising at least one salt of a noble metal.

6. The method of claim 1, wherein introducing comprises introducing at least part of the semiconductor device structure into the aqueous metal solution, with the at least one metal salt comprising a metal salt of at least one of platinum, rhodium, iridium, ruthenium, and palladium.

7. The method of claim 1, wherein introducing comprises introducing at least part of the semiconductor device structure into the aqueous metal solution, with the at least one reducing agent comprising at least one of dimethylaminoborane, a borohydride, and hydrazine.

8. The method of claim 1, wherein introducing comprises introducing at least part of the semiconductor device structure into the aqueous metal solution, with the at least one reducing agent comprising a substance that alters a grain structure of a metal of the at least one metal salt.

9. The method of claim 1, wherein introducing is effected with the aqueous metal solution at an initial temperature of about room temperature.

10. The method of claim 9, wherein, following introducing, the temperature of the aqueous metal solution is increased to at least about 70° C.

11. The method of claim 1, wherein fabricating the conductive structure is effected after introducing.

12. The method of claim 1, wherein fabricating the conductive structure is effected before introducing.

13. The method of claim 1, further comprising forming a second conductive structure over the dielectric layer.

14. The method of claim 1, wherein introducing comprises forming an oxidation barrier comprising a boron-doped metal.

15. The method of claim 1, wherein introducing comprises forming an oxidation barrier comprising a metal alloy.

16. The method of claim 1, wherein introducing comprises electroless plating.

17. A method for fabricating a capacitor structure of a semiconductor device structure, comprising:
providing a semiconductor device structure including a substrate having an active surface and with at least one active device region formed therein;
immersing the active surface of the substrate at least partially into a bath comprising at least one metal salt and at least one reducing agent so as to form an oxidation barrier layer; and
forming a dielectric layer over at least the oxidation barrier layer.

18. The method of claim 17, wherein immersing comprises forming a bottom electrode over at least the substrate and the at least one active device region thereof.

19. The method of claim 17, further comprising forming a bottom electrode in communication with the at least one active device region.

20. The method of claim 19, wherein forming the bottom electrode is effected prior to immersing.

21. The method of claim 19, wherein forming the bottom electrode is effected following immersing.

22. The method of claim 17, wherein immersing comprises introducing the active surface of the substrate at least partially into the bath, with the at least one metal salt comprising at least one salt of a noble metal.

23. The method of claim 17, wherein immersing comprises introducing the active surface of the substrate at least partially into the bath, with the at least one metal salt comprising a salt of at least one of platinum, rhodium, iridium, ruthenium, and palladium.

24. The method of claim 17, wherein introducing comprises introducing the active surface of the substrate at least partially into the bath, with the at least one reducing agent comprising at least one of dimethylaminoborane, a borohydride, and hydrazine.

25. The method of claim 17, wherein immersing comprises introducing the active surface of the substrate at least partially into the bath, with the at least one reducing agent comprising a substance that alters a grain structure of a metal of the at least one metal salt.

26. The method of claim 17, wherein immersing is effected with the bath at about room temperature.

27. The method of claim 26, comprising increasing a temperature of the bath to at least about 70° C.

28. The method of claim 17, further comprising forming a top electrode over the dielectric layer.

29. The method of claim 17, wherein immersing comprises forming an oxidation barrier layer comprising a boron-doped metal.

30. The method of claim 17, wherein immersing comprises forming an oxidation barrier layer comprising a metal alloy.

31. The method of claim 17, wherein immersing comprises electroless plating.

32. The method of claim 17, wherein forming the dielectric layer comprises forming a dielectric layer comprising at least one of $Ta_2O_5$ and barium strontium titanate.

33. The method of claim 17, further comprising forming a bottom electrode.

34. The method of claim 33, wherein forming the bottom electrode is effected before immersing.

35. The method of claim 33, wherein forming the bottom electrode is effected after immersing.

36. The method of claim 17, further comprising forming an upper electrode over the dielectric layer.

37. The method of claim 17, wherein the bath comprises 10 g/L $Na_2Pt(OH)_6$, 5 g/L NaOH, 10 g/L ethylamine, and 1 g/L hydrazine.

38. The method of claim 17, further comprising preparing the bath by dissolving a substantially pure platinum sponge in aqua regia to create a solution;
evaporating the solution with low heat to create residue;
dissolving the residue in about 4% by volume hydrochloric acid (HCl);
evaporating the solution; and
re-dissolving the residue in a volume of about 4% HCl at a volume of about 100 mL per gram of platinum.

39. The method of claim 17, wherein the bath further comprises a complexing agent and a stabilizer.

40. The method of claim 39, wherein the complexing agent comprises ethylenediamine, the stabilizer comprises rhodanine (2-mercapto-4-hydroxythiazole), the at least one reducing agent comprises sodium borohydride ($NaBH_4$) and the at least one metal salt comprises $Na_2PtCl_6$.

41. A method of forming a conductive oxidation barrier in a semiconductor device, comprising immersing an active surface of a semiconductor device into a bath comprising at least one metal salt and at least one reducing agent so as to form a conductive oxidation barrier over at least the active surface.

42. The method of claim 41, wherein immersing comprises introducing the active surface of the semiconductor device structure into the bath, with the at least one metal salt comprising a salt of at least one noble metal.

43. The method of claim 41, wherein immersing comprises introducing the active surface of the semiconductor device structure into the bath, with the at least one metal salt comprising a salt of at least one of palladium, rhodium, iridium, and ruthenium.

44. The method of claim 41, wherein immersing comprises introducing the active surface of the semiconductor device structure into the bath, with the at least one reducing agent comprising a substance that will alter a grain structure of a metal of the at least one metal salt.

45. The method of claim 41, wherein immersing comprises introducing the active surface of the semiconductor device structure into the bath, with the at least one reducing agent comprising at least one of dimethylaminoborane, a borohydride, and hydrazine.

46. The method of claim 41, wherein immersing is effected with the bath at about room temperature.

47. The method of claim 46, wherein the temperature of the bath is increased to at least about 70° C.

48. The method of claim 41, wherein immersing comprises forming an oxidation barrier comprising a boron-doped metal.

49. The method of claim 41, wherein immersing comprises forming an oxidation barrier comprising a metal alloy.

50. The method of claim 41, further comprising forming a dielectric structure adjacent the conductive oxidation barrier.

51. The method of claim 50, wherein forming the dielectric structure comprises forming a dielectric structure including at least one of $Ta_2O_5$ and barium strontium titanate.

52. The method of claim 41, wherein the bath comprises 10 g/L $Na_2Pt(OH)_6$, 5 g/L NaOH, 10 g/L ethylamine, and 1 g/L hydrazine.

53. The method of claim 41, further comprising preparing the bath by dissolving a substantially pure platinum sponge in aqua regia to create a solution;

evaporating the solution with low heat to create residue;

dissolving the residue in about 4% by volume hydrochloric acid (HCl);

evaporating the solution; and re-dissolving the residue in a volume of about 4% HCl at a volume of about 100 mL per gram of platinum.

54. The method of claim 41, wherein the bath further comprises a complexing agent and a stabilizer.

55. The method of claim 54, wherein the complexing agent comprises ethylenediamine, the stabilizer comprises rhodanine (2-mercapto-4-hydroxythiazole), the at least one reducing agent comprises sodium borohydride ($NaBH_4$) and the at least one metal salt comprises $Na_2PtCl_6$.

56. A method of fabricating an oxidation barrier in a semiconductor device comprising co-depositing a doped noble metal layer on an active surface of the semiconductor device.

57. The method of claim 56, further comprising forming a dielectric layer over the doped noble metal layer.

58. The method of claim 56, wherein co-depositing comprises immersing at least the active surface into an aqueous metal solution comprising at least one metal salt and at least one reducing agent.

59. The method of claim 56, wherein the doped noble metal layer comprises either phosphorous doped platinum or boron doped platinum.

60. The method of claim 56, wherein co-depositing comprises forming an oxidation resistant conductive structure of the semiconductor device.

61. The method of claim 56, wherein co-depositing comprises forming the oxidation barrier between a conductive structure and substrate of the semiconductor device.

62. The method of claim 56, wherein co-depositing comprises forming the oxidation barrier over a conductive structure of the semiconductor device.

63. The method of claim 56, wherein co-depositing comprises introducing at least the active surface into an aqueous metal solution comprising at least one salt of a noble metal and at least one reducing agent.

64. The method of claim 56, wherein co-depositing comprises introducing at least the active surface into an aqueous metal solution comprising a reducing agent and at least one metal salt comprising a metal salt of at least one of platinum, rhodium, iridium, ruthenium, and palladium.

65. The method of claim 56, wherein co-depositing comprises introducing at least the active surface into an aqueous metal solution comprising at least one metal salt and at least one reducing agent comprising at least one of dimethylaminoborane, a borohydride, and hydrazine.

66. The method of claim 56, wherein co-depositing comprises introducing at least the active surface into an aqueous metal solution comprising at least one metal salt and at least one reducing agent comprising a substance that alters a grain structure of a metal of the at least one metal salt.

* * * * *

UNITED STATES PATENT AND TRADEMARK OFFICE
CERTIFICATE OF CORRECTION

PATENT NO. : 6,774,049 B2
DATED : August 10, 2004
INVENTOR(S) : Rita J. Klein

It is certified that error appears in the above-identified patent and that said Letters Patent is hereby corrected as shown below:

Title page,
Item [56], References Cited, OTHER PUBLICATIONS, "Schlesinger, Mordechay," reference, change ".cwri." to -- .cwru. --

Column 1,
Line 21, delete "including"

Column 8,
Line 37, before "introducing" delete "the"

Column 10,
Line 24, change "re-dissolving" to -- redissolving --

Column 11,
Line 14, change "re-dissolving" to -- redissolving --

Column 12,
Line 9, after "and" and before "substrate" insert -- a --

Signed and Sealed this

Twenty-second Day of February, 2005

JON W. DUDAS
*Director of the United States Patent and Trademark Office*